(12) United States Patent
Shintaku et al.

(10) Patent No.: US 9,761,418 B2
(45) Date of Patent: Sep. 12, 2017

(54) PLASMA PROCESSING APPARATUS

(71) Applicant: TOKYO ELECTRON LIMITED, Tokyo (JP)

(72) Inventors: Masayuki Shintaku, Miyagi (JP); Takashi Suzuki, Miyagi (JP); Masahiko Konno, Miyagi (JP); Michitaka Aita, Miyagi (JP); Taizo Okada, Miyagi (JP); Hideo Kato, Miyagi (JP); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 357 days.

(21) Appl. No.: 14/519,688

(22) Filed: Oct. 21, 2014

(65) Prior Publication Data
US 2015/0107773 A1 Apr. 23, 2015

(30) Foreign Application Priority Data

Oct. 22, 2013 (JP) .................................. 2013-219280
Jan. 21, 2014 (JP) .................................. 2014-008405

(51) Int. Cl.
*C23C 16/00* (2006.01)
*C23F 1/00* (2006.01)
(Continued)

(52) U.S. Cl.
CPC .. *H01J 37/32642* (2013.01); *H01J 37/32192* (2013.01); *H01J 37/32275* (2013.01)

(58) Field of Classification Search
CPC .... H01J 37/32192–37/32311; H01J 37/32642; H05H 1/46; H05H 2001/4607;
(Continued)

(56) References Cited

U.S. PATENT DOCUMENTS 4,985,109 A * 1/1991 Otsubo ............. H01J 37/32357
  118/50.1
5,311,103 A * 5/1994 Asmussen ............. C23C 16/505
  118/723 R
(Continued)

FOREIGN PATENT DOCUMENTS

JP   2005-277369 A   10/2005
JP   2005-303099 A   10/2005

*Primary Examiner* — Rakesh Dhingra
(74) *Attorney, Agent, or Firm* — Rothwell, Figg, Ernst & Manbeck, P.C.

(57) ABSTRACT

A plasma processing apparatus for exciting a processing gas by a microwave, includes a focus ring extending in an annular shape, a first tubular member being wrapped around a central axis to extend along an outer periphery of the lower electrode below the focus ring, an annular member made of a dielectric material provided between the focus ring and the first tubular member a second tubular member extending along an outer periphery of the first tubular member and a choke portion suppressing a microwave propagating through the first tubular member via the focus ring and the annular member. And the choke portion protrudes outward in a diametrical direction of the first tubular from the outer periphery of the first tubular member and extends in an annular shape along the periphery of the first tubular member, the choke portion is covered by the second tubular member.

5 Claims, 19 Drawing Sheets

(51) Int. Cl.
*H01L 21/306* (2006.01)
*H01J 37/32* (2006.01)

(58) Field of Classification Search
CPC ... H05H 2001/4615; H05H 2001/4622; H05H 2001/463; C23C 16/511; C23C 16/515
USPC ............ 118/723 MW, 728–730; 156/345.41, 156/345.51–345.55
See application file for complete search history.

(56) References Cited

U.S. PATENT DOCUMENTS

| | | |
|---|---|---|
| 2005/0230049 A1 | 10/2005 | Nishio et al. |
| 2007/0169891 A1 | 7/2007 | Koshiishi et al. |
| 2011/0126765 A1* | 6/2011 | Yamazawa ........ H01J 37/32091 118/723 MW |

* cited by examiner

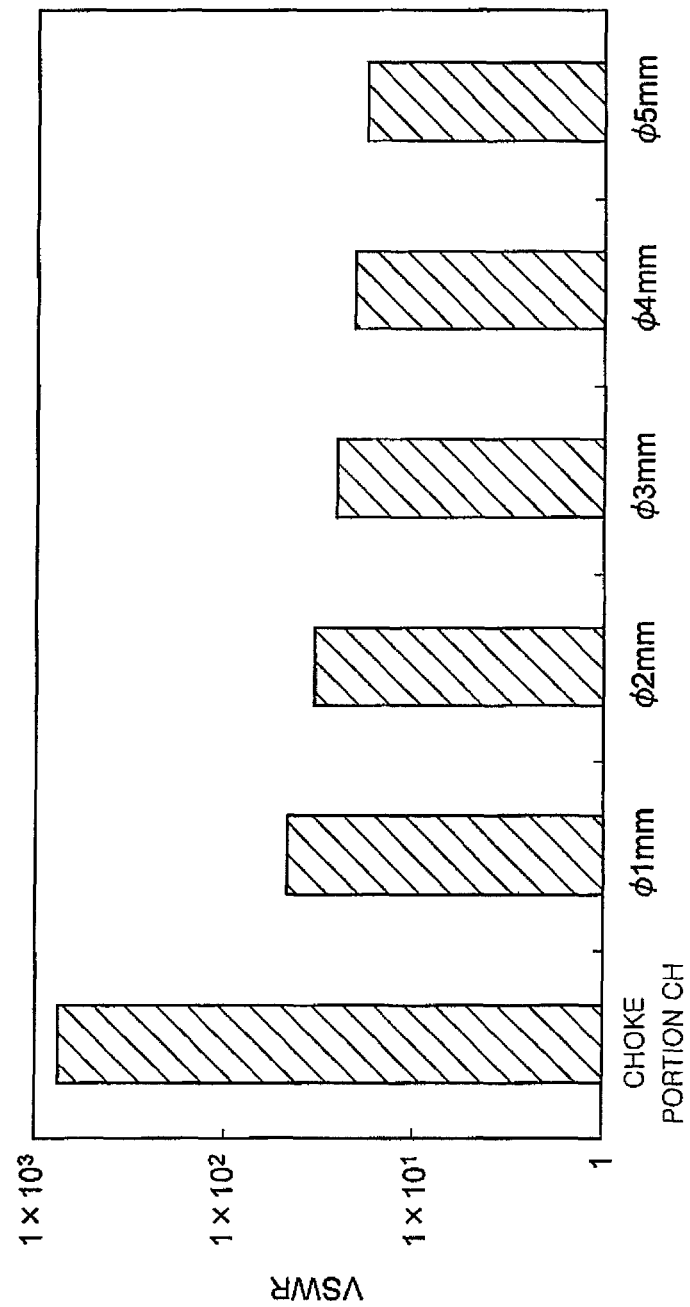

PLASMA PROCESSING APPARATUS

CROSS-REFERENCE TO RELATED APPLICATIONS

This application claims priority to Japanese Patent Applications Nos. 2013-219280 and 2014-008405 respectively filed on Oct. 22, 2013 and Jan. 21, 2014, the entire contents of which are incorporated herein by reference.

FIELD OF THE INVENTION

The present invention relates to a plasma processing apparatus.

BACKGROUND OF THE INVENTION

When electronic devices are manufactured, various plasma treatments are performed on an object to be processed. In a plasma processing apparatus for performing plasma treatment, a plasma is generated by exciting a gas supplied into a processing chamber. The object to be processed is processed by the plasma thus generated.

In the plasma processing apparatus, the object to be processed is mounted on a mounting table. The mounting table includes a lower electrode and an electrostatic chuck. The electrostatic chuck is provided on the lower electrode. The lower electrode is electrically connected to a high frequency power supply for generating a high frequency power.

In the plasma processing apparatus including such a mounting table, a focus ring may be used to perform uniform plasma treatment on the object to be processed, as described in Japanese Patent Application Publication Nos. 2005-277369 and 2005-303099. The focus ring is made of a dielectric material and disposed to surround the electrostatic chuck and the object to be processed. Further, the focus ring is supported by a dielectric member that is disposed to surround the lower electrode of the mounting table. By providing the focus ring, it is possible to control a sheath potential at an outer side of an edge of the object to be processed. As a result, the in-plane uniformity of the plasma treatment of the object to be processed can be controlled.

Meanwhile, there are various methods for exciting a processing gas. Recently, a plasma processing apparatus for exciting a processing gas by using a microwave attracts attention.

In the plasma processing apparatus using a microwave, the microwave propagates via the focus ring and the dielectric member which are disposed around the mounting table. The microwave propagating in such a manner may affect various components provided below the mounting table. For example, the microwave may make a high frequency power supplied from the high frequency power supply to the lower electrode unstable or cause malfunction of various measurement devices.

SUMMARY OF THE INVENTION

In view of the above, the plasma processing apparatus for exciting a processing gas by using a microwave needs to suppress a microwave propagating near the mounting table.

In accordance with the present invention, there is provided a plasma processing apparatus for exciting a processing gas by a microwave, including: a processing chamber; a mounting table provided in the processing chamber, the mounting table including a lower electrode and an electrostatic chuck provided on the lower electrode; a focus ring made of a dielectric material, extending in an annular shape so as to surround the electrostatic chuck; a first tubular member made of a dielectric material, the first tubular member being wrapped around a central axis to extend along an outer periphery of the lower electrode below the focus ring; an annular member made of a dielectric material, provided between the focus ring and the first tubular member; a conductive second tubular member extending along an outer periphery of the first tubular member; and a choke portion made of a dielectric material, serving to suppress a microwave propagating through the first tubular member via the focus ring and the annular member, wherein the choke portion protrudes outward in a diametrical direction of the first tubular from the outer periphery of the first tubular member and extends in an annular shape along the periphery of the first tubular member; the second tubular member includes an upper portion and a lower portion which are separable from each other; and the choke portion is interposed between the upper portion and the lower portion so as to be covered by the second tubular member. In the above embodiment, the first tubular member and the choke portion may be formed as one unit. In the above embodiment, a length of the choke portion in the diametrical direction is ¼ of a wavelength of the microwave in the choke portion.

In the above plasma processing apparatus, the microwave, i.e., the incident wave, propagates toward the first tubular member via the focus ring and the annular member. A part of the incident wave propagates toward the choke portion and then returns from the choke portion to the first tubular member. The choke portion returns the microwave having a phase difference of substantially a half wavelength to the incident wave, i.e., the reflection wave, to the first tubular member. In the above plasma processing apparatus, the incident wave is attenuated or cancelled by interference with the reflection wave from the choke portion. As a result, the microwave propagating through the first tubular member is suppressed. The choke portion protrudes outward in a diametrically direction from the first tubular member. In other words, the choke portion protrudes in a direction perpendicular to the propagation direction of the incident wave. Accordingly, the choke portion can effectively suppress the microwave. Further, the choke portion is held by the upper and the lower portion of the second tubular member. In other words, the choke portion does not have a screw hole or the like which may be required to hold the choke portion. Therefore, the leakage of the microwave propagating through the first tubular member can be suppressed. In the above plasma processing apparatus, the microwave propagating through the first tubular member is suppressed, so that a period of time from when the supply of the microwave is started until when the plasma become stable can be shortened.

In the above embodiment, the upper and the lower portion are fixed to each other at a diametrically outer side of the choke portion. In the above embodiment, the upper and the lower portion of the second tubular member can be fixed to each other without interference with the choke portion.

In the above embodiment, the plasma processing apparatus of claim 1, further including: one or more other choke portions made of a dielectric material, said one or more other choke portions serving to suppress the microwave propagating through the first tubular member via the focus ring and the annular member, protruding outward in the diametrical direction from the periphery of the first tubular member, and extending in an annular shape, wherein the choke portion and said one or more other choke portions are protruded from respective parts of the periphery of the first tubular member, the respect parts arranged along an extension direction of the central axis. In the above embodiment, the microwave propagating through the first tubular member can be further suppressed.

In the above embodiment, the choke portion and said one or more other choke portions have different lengths in the diametrical direction respectively. In the above embodiment, even if the wavelength of the microwave is changed by changing in a microwave transmitter, the microwave propagating through the first tubular member can be suppressed.

As described above, it is possible to suppress the microwave propagating near the mounting table of the plasma processing apparatus.

BRIEF DESCRIPTION OF THE DRAWINGS

The objects and features of the present invention will become apparent from the following description of embodiments, given in conjunction with the accompanying drawings, in which:

FIG. 14 is a graph showing a VSWR of the choke portion of the plasma processing apparatus and a VSWR of the choke portion of the third comparative example;

DETAILED DESCRIPTION OF THE EMBODIMENTS

Figure 1:
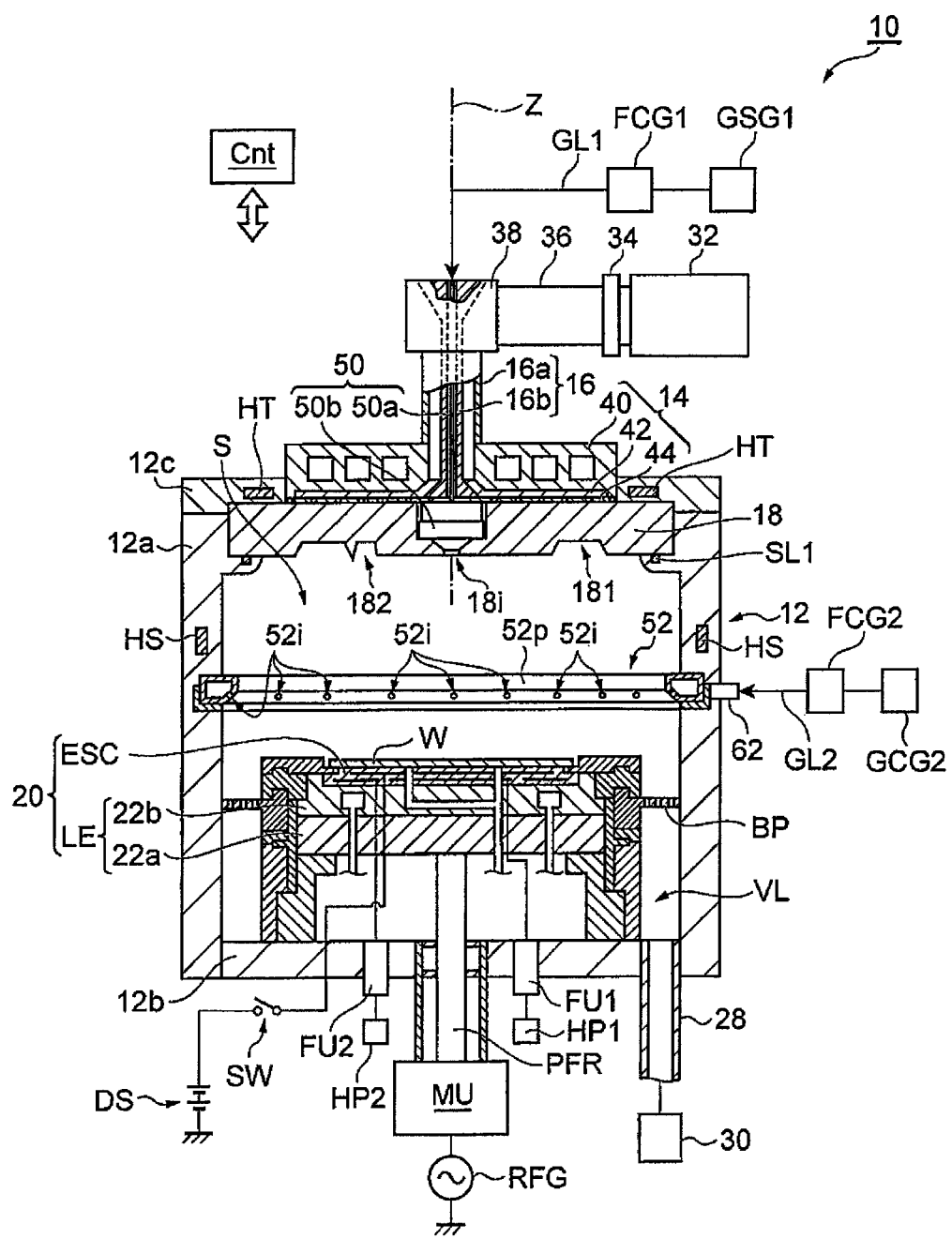
FIG. 1 schematically shows a plasma processing apparatus in accordance with an embodiment of the present invention.

Hereinafter, embodiments of the present invention will be described in detail with reference to the accompanying drawings. Further, like reference numerals will be used for like or corresponding parts throughout the drawings.

FIG. 1 schematically shows a plasma processing apparatus 10 in accordance with an embodiment of the present invention. In FIG. 1, a vertical cross section of the plasma processing apparatus is schematically illustrated. The plasma processing apparatus 10 shown in FIG. 1 generates a plasma by exciting a processing gas by using a microwave and processes an object to be processed (hereinafter, referred to as "wafer") W by using the plasma thus generated. The plasma processing apparatus 10 includes a processing chamber 12. The processing chamber 12 has therein a processing space S. In the plasma processing apparatus 10, a wafer W is accommodated in the processing space S and subjected to plasma treatment. In the present embodiment, the processing chamber 12 includes a sidewall 12a, a bottom portion 12b and a ceiling portion 12c. The sidewall 12a has a substantially cylindrical shape extending in an extension direction of an axis Z (hereinafter, referred to as "axis Z direction"). The bottom portion 12b is provided at a lower end of the sidewall 12a. An upper end of the sidewall 12a is opened. The opening formed at the upper end of the sidewall 12a is closed by a dielectric window 18. The dielectric window 18 is held between an upper end portion of the sidewall 12a and the ceiling portion 12c. A sealing member SL1 may be provided between the dielectric window 18 and the upper end portion of the sidewall 12a. The sealing member SL1 is, e.g., an O-ring, and contributes to airtight sealing of the processing chamber 12.

The plasma processing apparatus 10 further includes a mounting table 20. In the processing chamber 12, the mounting table 20 is provided below the dielectric window 18. The mounting table 20 includes a lower electrode LE and an electrostatic chuck ESC. The lower electrode LE is connected to a high frequency power supply RFG via a matching unit MU. The high frequency power supply RFG generates a high frequency power (high frequency bias power) for ion attraction. The electrostatic chuck ESC is provided on the lower electrode LE. The wafer W is attracted and held on the electrostatic chuck ESC by Coulomb force. The mounting table 20 and its neighboring components will be described in detail later.

As shown in FIG. 1, the plasma processing apparatus 10 may further include heaters HT and HS. The heater HT is provided in the ceiling portion 12c and extends in an annular shape so as to surround an antenna 14. The heater HS is provided in the sidewall 12a and extends in an annular shape.

In the present embodiment, the plasma processing apparatus 10 may further include, in order to introduce a microwave into the processing chamber 12, the antenna 14, a coaxial waveguide 16, the dielectric window 18, a microwave generator 32, a tuner 34, a waveguide 36, and a mode transducer 38. The microwave generator 32 generates a microwave having a frequency of GHz level, e.g., 2.45 GHz. The microwave generator 32 is connected to an upper portion of the coaxial waveguide 16 via the tuner 34, the waveguide and the mode transducer 38. The coaxial waveguide 16 extends along the axis Z. The center of a mounting region MR of the mounting table 20, i.e., the center of a region where the wafer W is mounted, is positioned on the axis Z.

The coaxial waveguide 16 includes an outer conductor 16a and an inner conductor 16b. The outer conductor 16a has a cylindrical shape extending in the axis Z direction. The central axis line of the outer conductor 16a substantially coincides with the axis Z. The lower end of the outer conductor 16a is electrically connected to the upper portion of a cooling jacket 40. The inner conductor 16b is disposed coaxially within the outer conductor 16a. In the present embodiment, the inner conductor 16b has a cylindrical shape extending in the axis Z direction. The lower end of the inner conductor 16b is connected to a slot plate 44 of the antenna 14.

In the present embodiment, the antenna 14 is a radial line slot antenna. The antenna 14 is disposed in the opening formed in the ceiling portion 12c and on the top surface of the dielectric window 18. The antenna 14 includes a dielectric plate 42 and the slot plate 44. The dielectric plate 42 shortens a wavelength of the microwave and has a substantially disc-shape. The dielectric plate 42 is made of, e.g., quartz or alumina. The dielectric plate 42 is interposed between the slot plate 44 and the bottom surface of the cooling jacket 40. Therefore, the antenna 14 includes the dielectric plate 42, the slot plate 44 and the bottom surface of the cooling jacket 40.

Figure 2:
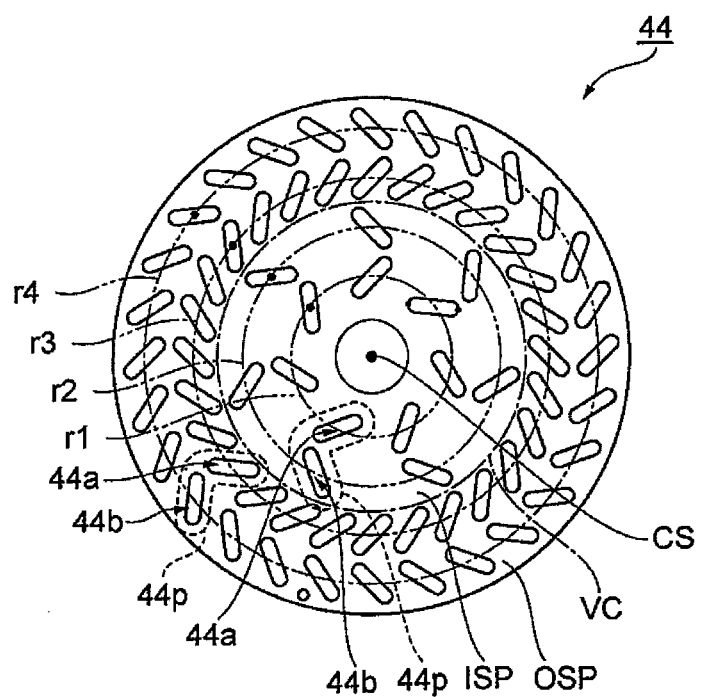
FIG. 2 is a top view showing an example of a slot plate.

FIG. 2 is a top view showing an example of the slot plate. The slot plate 44 is a disc-shaped thin plate. The slot plate 44 has flat opposite sides in a plate thickness direction. The center CS of the circular slot plate 44 is positioned on the axis Z. The slot plate 44 has multiple slot pairs 44p. Each slot pair 44p has two slot holes 44a and 44b formed through the slot plate 44 in the plate thickness direction. The slot holes 44a and 44b have an elongated hole shape when seen from the top. In each slot pair 44p, an extension direction of a long axis of the slot hole 44a intersects with or is perpendicular to an extension direction of a long axis of the slot hole 44b.

In the example shown in FIG. 2, the slot pairs 44p are divided into an inner slot pair group ISP disposed within a virtual circle VC centering about the axis Z and an outer slot pair group OPS disposed outside the virtual circle VC. The inner slot pair group ISP includes a plurality of slot pairs 44p. In the example shown in FIG. 2, the inner slot pair group ISP includes seven slot pairs 44p. The slot pairs 44p of the inner slot pair group ISP are arranged at a regular interval in a circumferential direction with respect to the center CS. The slot holes 44a included in the inner slot pair group ISP are arranged at a regular interval such that the centers of gravity of the slot holes 44a are positioned on a circle having a radius r1 from the center CS of the slot plate 44. Further, the slot holes 44b included in the inner slot pair group ISP are arranged at a regular interval such that the centers of gravity of the slot holes 44b are positioned on a circle having a radius r2 from the center CS of the slot plate 44. Here, the radius r2 is greater than the radius r1.

The outer slot pair group OSP includes a plurality of slot pairs 44p. In the example shown in FIG. 2, the outer slot pair group OSP includes 28 slot pairs 44p. The slot pairs 44p of the outer slot pair group OSP are arranged at a regular interval in a circumferential direction with respect to the center CS. The slot holes 44a included in the outer slot pair group OSP are arranged at a regular interval such that the centers of gravity of the slot holes 44a are positioned on a circle having a radius r3 from the center CS of the slot plate 44. Further, the slot holes 44b included in the outer slot pair group OSP are arranged at a regular interval such that the centers of gravity of the slot holes 44b are positioned on a circle having a radius r4 from the center CS of the slot plate 44. Here, the radius r4 is greater than the radius r3.

The slot holes 44a of the inner and the outer slot pair group ISP and OSP are formed in such a manner that the same angle is obtained between the long axis of each slot hole 44a and a segment connecting the center CS and the center of gravity of each slot hole 44a. The slot holes 44b of the inner and the outer slot pair group ISP and OSP are formed in such a manner that the same angle is obtained between the long axis of each slot hole 44b and a segment connecting the center CS and the center of gravity of each slot hole 44b.

Figure 3:
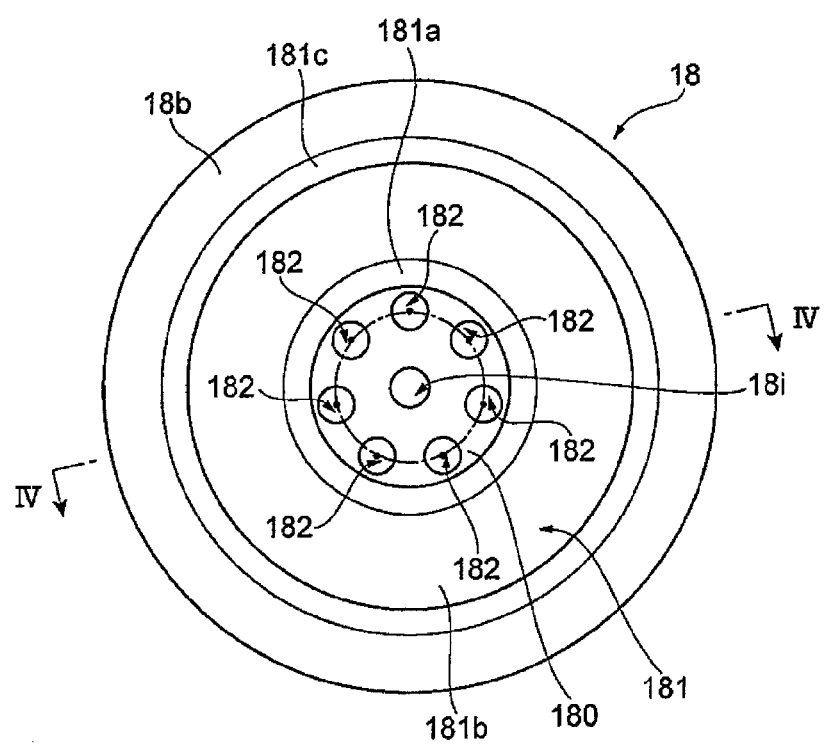
FIG. 3 is a top view showing an example of a dielectric window.
Figure 4:
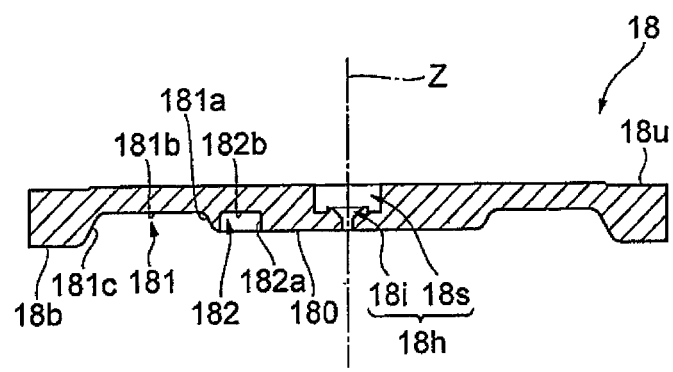
FIG. 4 is a cross sectional view taken along line IV-IV shown in FIG. 3.

FIG. 3 is a top view showing an example of the dielectric window and illustrates a state in which the dielectric window is seen from the processing space S side. FIG. 4 is a cross sectional view taken along line IV-IV shown in FIG. 3. The dielectric window 18 has a substantially disc shape and is made of a dielectric material such as alumina, quartz or the like. The slot plate 44 is provided on a top surface 18u of the dielectric window 18.

A through hole 18h is formed at the center of the dielectric window 18. An upper portion of the through hole 18h serves as a space 18s accommodating an injector 50b of a central introduction unit 50 which will be described later. A lower portion of the through hole 18h serves as a central introduction port 18i of the central introduction unit 50 which will be described later. Further, the central axis of the dielectric window 18 coincides with the axis Z.

A surface opposite to the top surface 18u of the dielectric window, i.e., a bottom surface 18b, is in contact with the processing space S where a plasma is generated. The bottom surface 18b has various shapes. Specifically, the bottom surface 18b has a flat surface 180 at a central region surrounding the central introduction port 18i. The flat surface 180 is perpendicular to the axis Z. The bottom surface 18b further has a first recess 181 that extends in an annular shape in a diametrically outer region of the bottom surface 180 and is recessed inwardly in a tapered shape in the plate thickness direction of the dielectric window 18.

The first recess 181 is defined by an inner tapered surface 181a, a bottom surface 181b, and an outer tapered surface 181c. The bottom surface 181b is close to the top surface 18u compared to the flat surface 180 and extends in an annular shape in parallel to the flat surface 180. The inner tapered surface 181a extends in an annular shape between the flat surface 180 and the bottom surface 181b and is inclined with respect to the flat surface 180. The outer tapered surface 181c extends in an annular shape between the bottom surface 181b and a peripheral portion of the bottom surface 18b and is inclined with respect to the bottom surface 181b. Further, the peripheral region of the bottom surface 18b is in contact with the sidewall 12a.

The bottom surface 18b has a plurality of second recesses 182 that are recessed inwardly in the plate thickness direction from the flat surface 180. Seven recesses 182 are formed in the example shown in FIGS. 3 and 4. The second recesses 182 are formed at a regular interval along the circumferential direction. Further, the second recesses 182 have a circular planar shape on a surface perpendicular to the axis Z. Specifically, an inner surface 182a forming the second recess 182 is a cylindrical surface extending in the axis Z direction. Further, a bottom surface 182b of the second recess 182 is a circular surface that is in parallel to the flat surface 180 and close to the top surface 18*u* compared to the flat surface 180.

Figure 5:
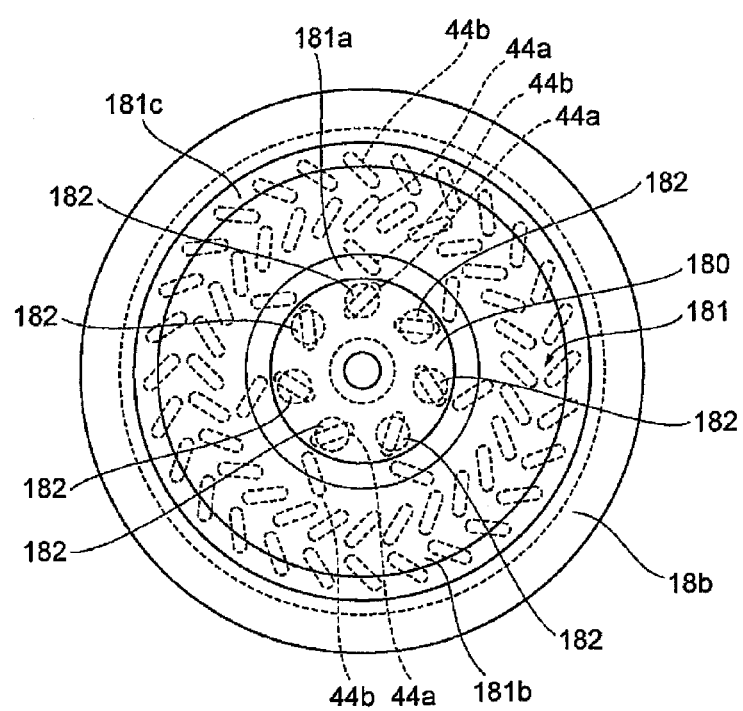
FIG. 5 is a top view showing a state in which the slot plate shown in FIG. 2 is provided on the dielectric window shown in FIG. 3.

FIG. 5 is a top view showing a state in which the slot plate shown in FIG. 2 is provided on the dielectric window shown in FIG. 3 and illustrates the dielectric window 18 seen from the bottom. As shown in FIG. 5, in a plan view, i.e., when seen in the axis Z direction, the slot holes 44*a* and 44*b* of the outer slot pair group OSP and the slot holes 44*b* of the inner slot pair group ISP are overlapped with the first recess 181. Specifically, in a plan view, parts of the slot holes 44*b* of the outer slot pair group OSP are partially overlapped with the outer tapered surface 181*c* and other parts of the slot holes 44*b* are overlapped with the bottom surface 181*b*. When seen from the top, the slot holes 44*a* of the outer slot pair group OSP are overlapped with the bottom surface 181*b*. In a plan view, parts of the slot holes 44*b* of the inner slot pair group ISP are overlapped with the inner tapered surface 181*a* and other parts of the slot holes 44*b* are overlapped with the bottom surface 181*b*.

In a plan view, i.e., when seen in the axis Z direction, the slot holes 44*a* of the inner slot pair group ISP are overlapped with the second recess 182. Specifically, in a plan view, the centers of gravity (the centers) of the bottom surfaces of the second recesses 182 are positioned within the slot holes 44*a* of the inner slot pair group ISP.

FIG. 1 will be referred to again. In the plasma processing apparatus 10, the microwave generated by the microwave generator 32 propagates toward the dielectric plate 42 through the coaxial waveguide 16 and then reaches the dielectric window 18 through the slot holes 44*a* and 44*b* of the slot plate 44.

In the dielectric window 18, the plate thickness of the first recess 181 and the plate thickness of the second recess 182 are smaller than the plate thickness of the other portions, as described above. Therefore, in the dielectric window 18, the portions where the first and the second recess 181 and 182 are formed have high microwave transmission properties. Further, when seen in the axis Z direction, the slot holes 44*a* and 44*b* of the outer slot pair group OSP and the slot holes 44*b* of the inner slot pair group ISP are overlapped with the first recess 181, and the slot holes 44*a* of the inner slot pair group ISP are overlapped with the second recess 182. Therefore, an electric field of the microwave is concentrated at the first and the second recess 181 and 182 and, thus, the energy of the microwave is concentrated at the first and the second recess 181 and 182. As a result, the plasma can be stably generated at the first and the second recess 181 and 182 and it is possible to standby generate the plasma distributed in the diametrical and the circumferential directions directly below the dielectric window 18.

The plasma processing apparatus 10 includes the central introduction unit 50 and a peripheral introduction unit 52. The central introduction unit 50 has a conduit 50*a*, the injector 50*b*, and the central introduction port 18*i*. The conduit 50*a* extends through the inner hole of the inner conductor 16*b* of the coaxial waveguide 16. Further, an end portion of the conduit 50*a* extends into the space 18*s* (see FIG. 4) formed at the dielectric window 18 along the axis Z. The injector 50*b* is accommodated inside the space 18*s* and below the end portion of the conduit 50*a*. The injector 50*b* has a plurality of through holes extending in the axis Z direction. Further, the dielectric window 18 has the central introduction port 18*i*. The central introduction port 18*i* extends downward from the space 18*s* along the axis Z. The central introduction unit 50 configured as described above supplies a gas into the injector 50*b* through the conduit 50*a*, and the gas is injected from the injector 50*b* through the central introduction port 18*i*. In this manner, the central introduction unit 50 allows the gas to be injected to the space directly below the dielectric window along the axis Z. In other words, the central introduction unit 50 introduces the gas into a plasma generation region where an electron temperature is high.

The peripheral introduction unit 52 has a plurality of peripheral introduction ports 52*i*. The gas is supplied to the edge region of the wafer W through the peripheral introduction ports 52*i*. The peripheral introduction ports 52*i* open toward the edge region of the wafer W or the circumference of the mounting region MR. The peripheral introduction ports 52*i* are arranged along the circumferential direction below the central introduction port 18*i* and above the mounting table 20. In other words, the peripheral introduction ports 52*i* are arranged in an annular shape about the axis Z in a region directly below the dielectric window where the electron temperature is low (plasma diffusion region). The peripheral introduction unit 52 supplies a gas from the low electron temperature region toward the wafer W. Therefore, the dissociation degree of the gas introduced into the processing space S from the peripheral introduction unit 52 is lower than that of the gas supplied to the processing space S from the central introduction unit 50.

A first gas source group GSG1 is connected to the central introduction unit 50 via a first flow rate control unit group FCG1. Further, a second gas source group GSG2 is connected to the peripheral introduction unit 52 via a second flow rate control unit group FCG2. The first gas source group GSG1 includes a plurality of first gas sources, and the first flow rate control unit group FCG1 includes a plurality of first flow rate control units. The first gas sources are connected to a common gas line GL1 via the first flow rate control units, respectively. The common gas line GL1 is connected to the central introduction unit 50. Further, each of the first flow rate control units includes, e.g., two valves, and a flow rate controller disposed between the two valves. The flow rate controller is, e.g., a mass flow controller.

The second gas source group GSG2 includes a plurality of second gas sources, and the second flow rate control unit group FCG2 includes a plurality of second flow rate control units. The second gas sources are connected to a common gas line GL2 via the second flow rate control units, respectively. The common gas line GL2 is connected to the peripheral introduction unit 52. Further, each of the second flow rate control units includes, e.g., two valves and a flow rate controller disposed between the two valves. The flow rate controller is, e.g., a mass flow controller.

As described above, in the plasma processing apparatus 10, the first gas sources and the first flow rate control units are provided only for the central introduction unit 50, and the second gas sources and the second flow rate control units which are independent from the first gas sources and the first flow rate control units are provided only for the peripheral introduction unit 52. Therefore, types and flow rates of one or more gases contained in the processing gas introduced from the central introduction unit 50 into the processing space S can be independently controlled. Further, types and flow rates of one or more gases contained in the processing gas introduced from the peripheral introduction unit 52 into the processing space S can be independently controlled.

In the present embodiment, the plasma processing apparatus 10 may further include a controller Cnt as shown in FIG. 1. The controller Cnt may be a control device such as a programmable computer device or the like. The controller Cnt can control the components of the plasma processing apparatus 10 in accordance with a program based on a recipe. For example, the controller Cnt can control types and flow rates of gases supplied to the central introduction unit 50 by transmitting control signals to the flow rate control units of the first flow rate control unit group FCG1. Further, the controller Cnt can control types and flow rates of the gases supplied to the peripheral introduction unit 52 by transmitting control signals to the flow rate control units of the second flow rate control unit group FCG2. In addition, the controller Cnt can control a microwave power, a power level and an ON/OFF state of the RF power, and a pressure in the processing chamber 12 by transmitting control signals to the microwave generator 32, the high frequency power supply RFG, and the gas exhaust unit 30.

In the present embodiment, the peripheral introduction unit 52 further includes an annular line 52p. The annular line 52p has a plurality of peripheral introduction ports 52i. The annular line 52p may be made of, e.g., quartz. In the present embodiment, the annular line 52p is disposed along an inner wall surface of the sidewall 12a as shown in FIG. 1. In other words, the annular line 52p is not disposed on a path that connects the bottom surface of the dielectric window 18 and the mounting region MR, i.e., the wafer W. Accordingly, the annular line 52p does not disturb diffusion of the plasma. Since the annular line 52p is disposed along the inner wall surface of the sidewall 12a, the wear of the annular line 52p due to the plasma is suppressed, and the exchange frequency of the annular line 52p can be reduced. Further, the annular line 52p is provided along the sidewall 12a whose temperature can be controlled by the heater, so that the stability of the temperature of the gas introduced from the peripheral introduction unit 52 into the processing space S can be improved.

In the present embodiment, the peripheral introduction ports 52i open toward the edge region of the wafer W. In other words, the peripheral introduction ports 52i are inclined with respect to a plane perpendicular to the axis Z so that the gas can be injected toward the edge region of the wafer W. Since the peripheral introduction ports 52i are inclined toward the edge region of the wafer W, active species of the gas injected from the peripheral introduction ports 52i are directly directed toward the edge region of the wafer W. Accordingly, it is possible to supply the active species of the gas to the edge region of the wafer W without inactivating them. As a result, a difference in processing rates of the respective regions in the diametrical direction of the wafer W can be reduced.

Figure 6:
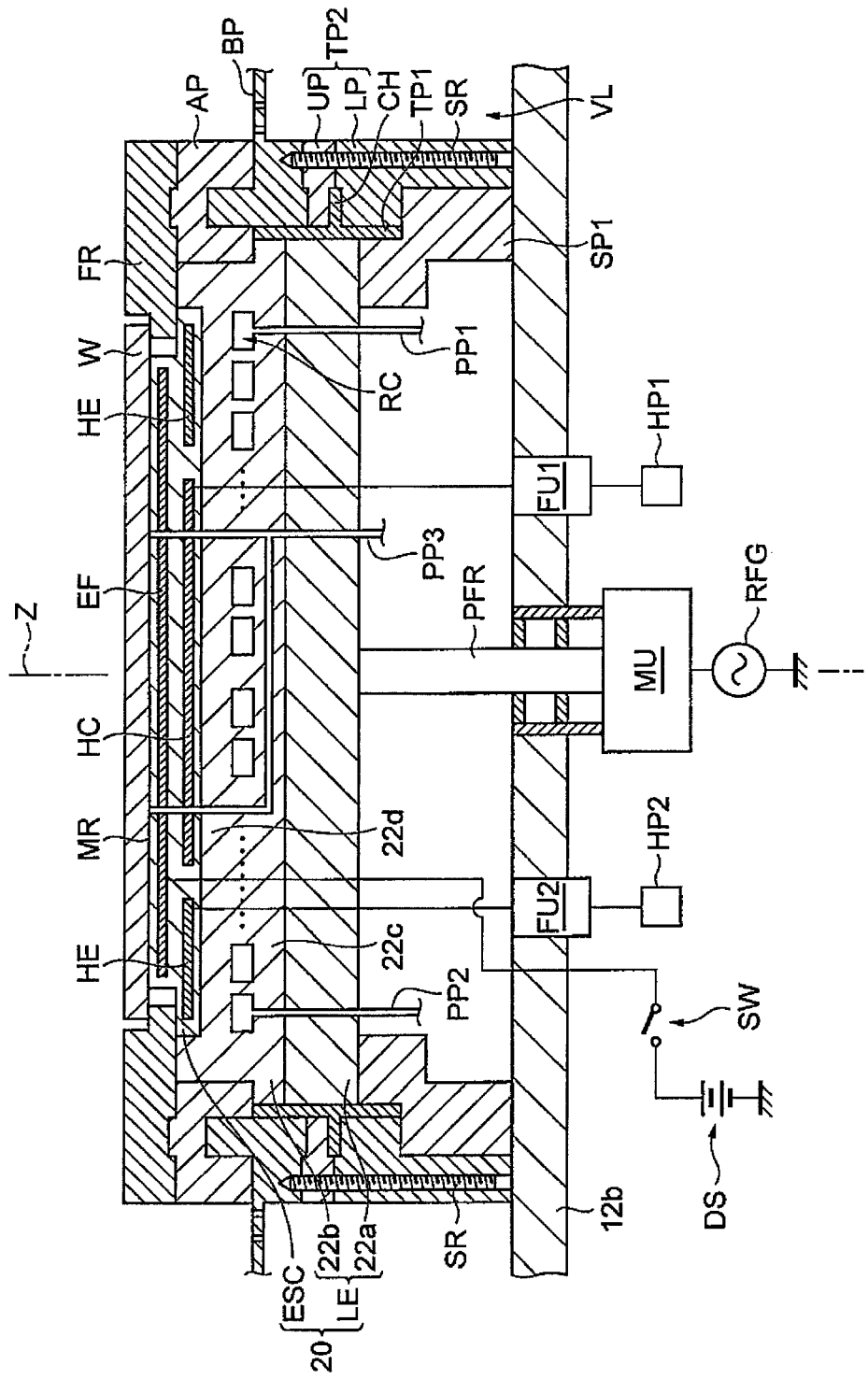
FIG. 6 is an enlarged view showing a mounting table of the plasma processing apparatus shown in FIG. 1 and its neighboring components.
Figure 7:
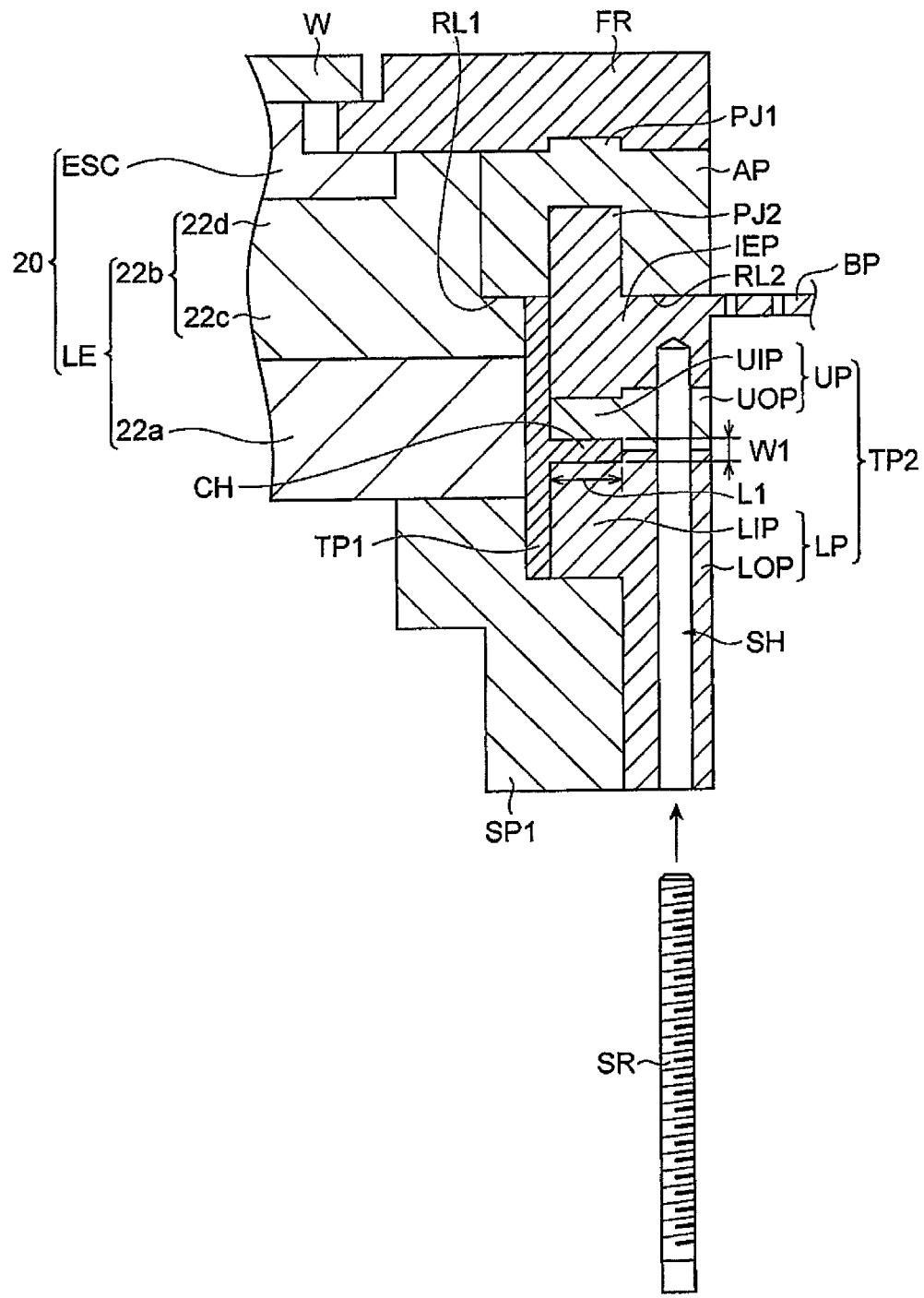
FIG. 7 is an enlarged view showing a part of the configuration shown in FIG. 6.

Hereinafter, the mounting table of the plasma processing apparatus 10 and its neighboring components will be described in detail with reference to FIGS. 1, 6 and 7. FIG. 6 is an enlarged view of the mounting table of the plasma processing apparatus shown in FIG. 1 and its neighboring components. FIG. 7 is an enlarged view of a part of the configuration shown in FIG. 6. As described above, the mounting table 20 includes the lower electrode LE and the electrostatic chuck ESC.

In the present embodiment, the lower electrode LE has a first plate 22a and a second plate 22b. The first plate 22a is a substantially disc-shaped member. Further, the first plate 22a is a conductive member made of, e.g., aluminum. The central axis of the first plate 22a substantially coincides with the axis Z. The first plate 22a is supported by a substantially cylindrical support SP1. The supporting portion SP1 extends upward from the bottom portion 12b and is brought into contact with the peripheral portion of the bottom surface of the first plate 22a. The support SP1 is made of an insulating material (dielectric material) such as quartz or the like.

The second plate 22b is provided on the first plate 22a. The second plate 22b is a substantially disc-shaped member. Further, the second plate 22b is a conductive member made of, e.g., aluminum. The second plate 22b is electrically connected to the first plate 22a. The central axis of the second plate 22b substantially coincides with the axis Z. In the present embodiment, the second plate 22b has a large diameter portion 22c and a small diameter portion 22d. The large diameter portion 22c is disposed below the small diameter portion 22d and continued from the small diameter portion 22d. The diameter of the large diameter portion 22c is greater than that of the small diameter portion 22d and substantially equal to that of the first plate 22a.

The high frequency power supply RFG is electrically connected to the first plate 22a via a power feed rod PFR and a matching unit MU. The high frequency power supply RFG outputs a high frequency bias power having a frequency suitable for controlling energy of ions attracted to the wafer W, e.g., 13.65 MHz. The matching unit MU accommodates a matcher for matching an impedance of the high frequency power supply RFG side and an impedance of a load side that is mainly the electrode, the plasma, the processing chamber or the like. The matcher has therein a blocking capacitor for self-bias generation.

The second plate 22b has therein a coolant channel RC. The coolant channel RC extends in a spiral shape around the axis Z. A coolant, e.g., cooling water, having a predetermined temperature is supplied into the coolant channel RC from a chiller unit through pipes PP1 and PP2 and circulated therein. The temperature of the wafer W on the electrostatic chuck ESC can be controlled by the circulating coolant. Further, a heat transfer gas, e.g., He gas, from a heat transfer gas supply unit is supplied to a gap between the top surface of the electrostatic chuck ESC and the backside of the wafer W through a pipe PP3.

The electrostatic chuck ESC is provided on the top surface of the second plate 22b. The electrostatic chuck ESC has a substantially disc shape, and the central axis thereof substantially coincides with the axis Z. The top surface of the electrostatic chuck ESC serves as a mounting region MR on which the wafer W is mounted. The mounting region MR has a substantially circular shape, and the center thereof is substantially positioned on the axis Z. The electrostatic chuck ESC holds the wafer W thereon by electrostatic attraction force. To do so, the electrostatic chuck ESC includes an electrode film EF provided in a dielectric film. A DC power supply DS is electrically connected to the electrode film EF via a switch SW. The wafer W can be attracted and held on the top surface of the electrostatic chuck ESC by Coulomb force generated by a DC voltage applied from the DC power supply DS.

Further, heaters HC and HE are provided in the dielectric film of the electrostatic chuck ESC. The heaters HC and HE are formed of, e.g., heating wire. The heater HC is provided below the electrode film EF and below the central portion of the mounting region MR, i.e., in a region intersecting with the axis Z. The heater HE is provided below the electrode film EF and extends so as to surround the heater HC. The heater HE is provided below the edge region of the mounting region MR.

A heater power supply HP1 is connected to the heater HC via a filter unit FU1. The heater power supply HP1 supplies an AC power to the heater HC. The filter unit FU1 suppresses the high frequency power flowing from the high frequency power supply RFG to the heater power supply HP1. The filter unit FU1 is formed as, e.g., an LC filter. Further, a heater power supply HP2 is connected to the heater HE via a filter unit FU2. The heater power supply HP2 supplies an AC power to the heater HE. The filter unit FU2 suppresses the high frequency power flowing from the high frequency power supply RFG to the heater power supply HP2. The filter unit FU2 is formed as, e.g., an LC filter. The filter units FU1 and FU2 suppress the flow of the high frequency power from the high frequency power supply RFG to the heater power supply and the consumption thereof.

In addition, a focus ring FR is provided at a diametrically outer side of the electrostatic chuck ESC. The focus ring FR extends in an annular shape along the edge of the electrostatic chuck ESC and the edge of the wafer W so as to surround the electrostatic chuck ESC. The focus ring FR is made of a dielectric material such as quartz or the like. The focus ring FR controls a sheath potential at the outer side of the edge of the wafer W and contributes to in-plane uniformity of the plasma processing of the wafer W.

A first tubular member TP1 is provided below the focus ring FR. The first tubular member TP1 is made of a dielectric material such as alumina or the like. The first tubular member TP1 has a cylindrical shape and extends along the outer peripheral surface of the lower electrode LE. In the present embodiment, the first tubular member TP1 extends along the outer peripheral surface of the upper portion of the support SP1, the outer peripheral surface of the first plate 22a and the outer peripheral surface of the large diameter portion 22c of the second plate 22b.

An annular member AP is provided between the first tubular member TP1 and the focus ring FR. The annular member AP is made of a dielectric material such as alumina or the like. The annular member AP extends in an annular shape along the outer peripheral surface of the small diameter portion 22d of the second plate 22b. The top surface of the annular member AP is in contact with the bottom surface of the focus ring FR. In the present embodiment, the top surface of the annular member AP includes an upwardly protruding protrusion PJ1. The protrusion PJ1 extends in an annular shape between the inner periphery and the outer periphery of the top surface of the annular member AP. Meanwhile, the bottom surface of the focus ring FR has a recess to be engaged with the protrusion PJ1. Accordingly, when the focus ring FR is mounted on the annular member AP, the position of the focus ring FR is determined.

A recess is formed at the bottom surface of the annular member AP. The recess extends in an annular shape between the inner periphery and the outer periphery of the bottom surface of the annular member AP. The bottom surface of the annular member AP includes a region RL1 positioned at a diametrically inner side of the recess and a region RL2 positioned at a diametrically outer side of the recess. The region RL1 is in contact with a stepped surface between the large diameter portion 22c and the small diameter portion 22d of the second plate 22b and the upper end surface of the first tubular member TP1.

A second tubular member TP2 is formed below the region RL2 and the recess formed at the annular member AP. The second tubular member TP2 substantially has a cylindrical shape. The second tubular member TP2 extends along the outer peripheral of the first tubular member TP1. In the present embodiment, the second tubular member TP2 is in contact with a region between the lower end and an intermediate portion in the axis Z direction of the outer peripheral surface of the first tubular member TP1. The second tubular member TP2 is also in contact with the outer peripheral surface of the lower portion of the support SP1. The second tubular member TP2 is made of a conductive material, e.g., aluminum. In the present embodiment, a film made of $Y_2O_3$ may be formed on the surface of the second tubular member TP2. Or, the surface of the second tubular member TP2 may be oxidized.

A gas exhaust passage VL is formed between the sidewall 12a and the outer peripheral surface of the second tubular member TP2 and the outer peripheral surface of the annular member AP. The gas exhaust passage VL extends to the bottom portion 12b and is connected to a gas exhaust line 28 provided at the bottom portion 12b. A gas exhaust unit 30 is connected to the gas exhaust line 28. The gas exhaust unit 30 includes a pressure control unit and a vacuum pump such as a turbo molecular pump or the like. By operating the gas exhaust unit 30, a gas can be exhausted from the outer periphery of the mounting table 20 through the gas exhaust passage VL and a pressure in the processing space S in the processing chamber 12 can be decreased to a desired vacuum level.

A baffle plate BP is provided at an intermediate portion in the axis Z direction of the gas exhaust line VL. The baffle plate BP is a plate-shaped member extending in an annular shape about the axis Z. The baffle plate BP has a plurality of through holes. The through holes penetrate through the baffle plate BP in the axis Z direction.

An inner edge portion IEP of the baffle plate BP is provided between the second tubular member TP2 and the annular member AP. A protrusion PJ2 is formed on the top surface of the inner edge portion IEP of the baffle plate BP. The protrusion PJ2 is engaged with the recess formed in the bottom surface of the annular member AP. Further, at the outer side of the protrusion PJ2, the top surface of the inner edge portion IEP of the baffle plate BP is in contact with the region RL2 of the annular member AP. Moreover, the bottom surface of the inner edge portion IEP of the baffle plate BP is in contact with the top surface of the second tubular member TP2.

Further, the plasma processing apparatus 10 includes a choke portion CH. The choke portion CH suppresses the microwave propagating through the first tubular member TP1 via the focus ring FR and the annular member AP. The choke portion CH protrudes outward in a diametrical direction from the first tubular member TP1 with respect to the axis Z. Further, the choke portion CH extends in an annular shape substantially about the axis Z. The choke portion CH is made of a dielectric material such as alumina or the like. A length L1 between an inner periphery and an outer periphery of the choke portion CH is ¼ of the wavelength of the microwave in the choke portion CH.

In the present embodiment, the choke portion CH and the first tubular member TP1 are formed as one unit. In other words, the tubular member TP1 and the choke portion CH may form as one unit a substantially cylindrical member made of a dielectric material. Such a member may have at its intermediate portion in the axis Z direction a chock portion CH having an outer diameter greater than that of its upper and lower portion.

The choke portion CH is covered by the second tubular member TP2. The second tubular member TP2 can be separated into an upper portion and a lower portion. Specifically, the second tubular member TP2 includes an upper portion UP and a lower portion LP. The upper portion UP has an inner region UIP and an outer region UOP disposed at a diametrically outer side of the inner region UIP. In the same manner, the lower portion LP has an inner region LIP and an outer region LOP disposed at a diametrically outer side of the inner region LIP. A space where the choke portion CH is accommodated is formed between the inner region UIP of the upper portion UP and the inner region LIP of the lower portion LP. The choke portion CH accommodated in the corresponding space is disposed between the upper portion UP and the lower portion LP. Further, the outer region UOP of the upper portion UP and the outer region LOP of the lower portion LP are in contact with each other and are also in contact with an outer peripheral surface of the choke portion CH.

In the present embodiment, the upper portion UP and the lower portion LP are fixed to each other by a screw SR at a diametrically outer side of the choke portion CH. In the present embodiment, a screw hole SH is formed in the outer region UOP of the upper portion UP, the outer region LOP of the lower portion LP, and the inner edge portion IEP of the baffle plate BP. The screw hole SH extends in the axis Z direction across the outer region UOP of the upper portion UP, the outer region LOP of the lower portion LP, and the inner edge portion IEP of the baffle plate BP. By inserting the screw SR into the screw hole SH, the upper portion UP and the lower portion LP of the second tubular member TP2 are fixed to each other. The inner edge portion IEP of the baffle plate BP is also fixed together with the upper portion UP and the lower portion LP of the second tubular member TP2.

In the plasma processing apparatus 10, the microwave, i.e., the incident wave, can propagate toward the first tubular member TP1 via the focus ring FR and the annular member AP. The incident wave propagates downward in the first tubular member TP1. A part of the incident wave propagates toward the choke portion CH and is reflected by the outer peripheral surface of the choke portion CH. Then, it is returned as a reflection wave to the first tubular member TP1. As described above, the choke portion CH has a length that is ¼ of the wavelength of the microwave in the choke portion CH. Therefore, the reflection wave having a phase difference that is one half of the wavelength of the incident wave is returned to the first tubular member TP1 by the choke portion CH. In the plasma processing apparatus 10, the incidence wave is attenuated or cancelled by interference with the reflection wave. As a result, the microwave propagating through the first tubular member TP1 is suppressed. In the plasma processing apparatus 10, since the microwave propagating through the first tubular member TP1 is suppressed, it is possible to shorten a period of time from when the supply of the microwave from the microwave generator 32 is started until the impedance adjustment by the tuner 34 becomes stable. As a result, it is possible to shorten a period of time from when the supply of the microwave is started until the plasma generated in the processing space S becomes stable.

The choke portion CH protrudes outward in the diametrical direction from the first tubular member TP1. In other words, the choke portion CH protrudes in a direction perpendicular to the propagation direction of the incident wave. Hence, the choke portion CH can effectively suppress the microwave.

Further, the choke portion CH has a length that is ¼ of the wavelength of the microwave in the dielectric member, which is a considerably small size compared to the wavelength of the high frequency power supplied to the lower electrode LE. Moreover, the frequency of the high frequency bias power ranges from several hundreds of KHz to ten and several MHz. Therefore, the choke portion CH hardly affects the impedance that determines the sheath potential on the focus ring FR.

In the plasma processing apparatus 10, the thickness of the first tubular member TP1 in the diametrical direction is small. Further, the wavelength of the microwave in the choke portion CH made of a dielectric material is shorter than the wavelength of the microwave in the vacuum, so that the length of the choke portion CH which is required to suppress the microwave in the first tubular member TP1 is small. Accordingly, the choke portion CH can be provided without interference with the gas exhaust passage VL. In other words, the choke portion CH does not affect the conductance of the gas exhaust passage VL.

The choke portion CH is held by the upper portion UP and the lower portion LP of the second tubular member TP2. In other words, the choke portion CH does not have a screw hole or the like which may be required to hold the choke portion CH. Therefore, it is possible to suppress leakage of the microwave propagating through the first tubular member TP1.

Hereinafter, simulation performed to evaluate the plasma processing apparatus 10 will be described. Simulations of a first and a second comparative example will be also described for comparison with the plasma processing apparatus 10.

Figure 8:
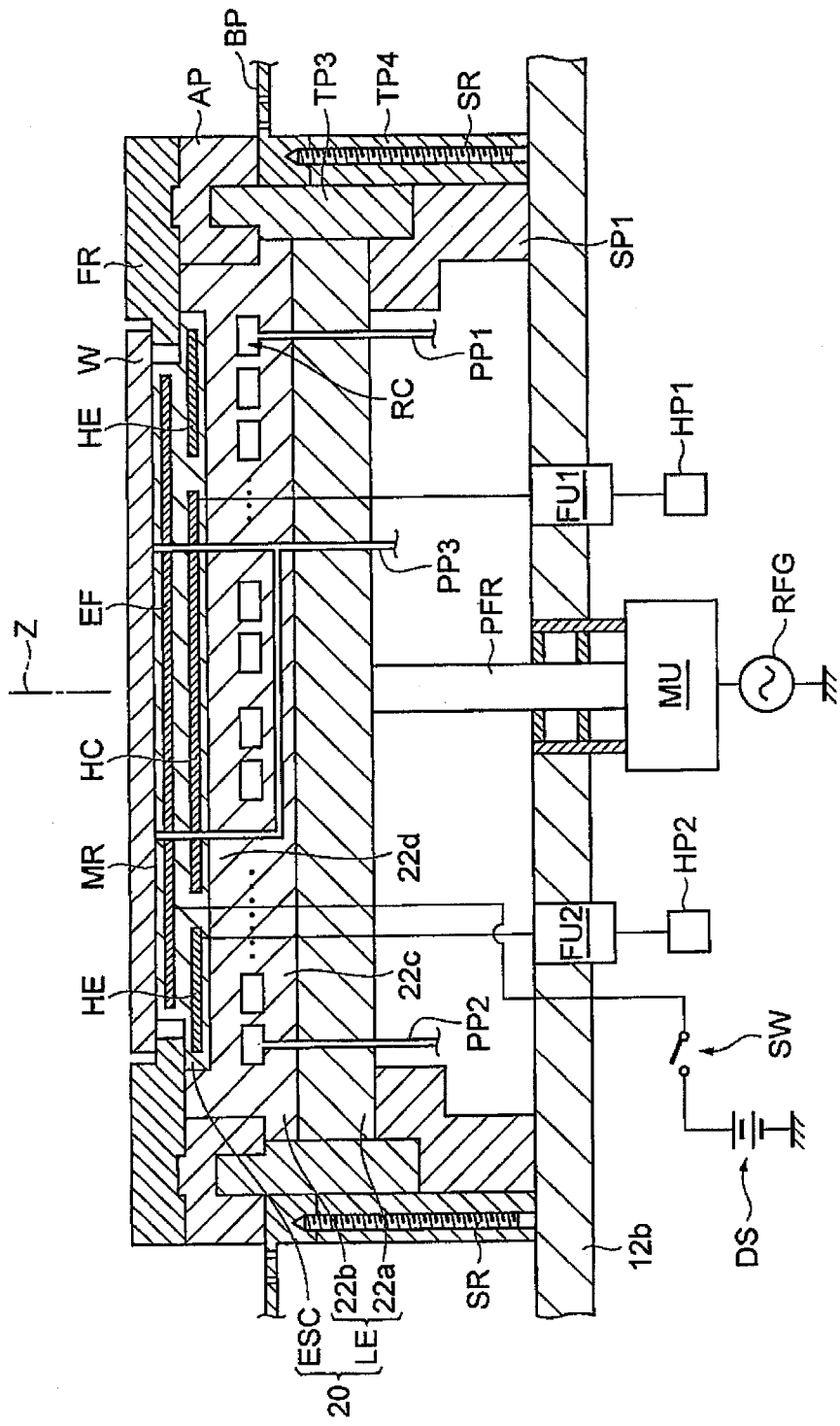
FIG. 8 shows a mounting table and its neighboring components of a first comparative example.

First, a mounting table of the first comparative example and its neighboring components will be described. FIG. 8 shows the mounting table of the first comparative example and its neighboring components. Hereinafter, the difference between the first comparative example and the plasma processing apparatus 10 will be described. As shown in FIG. 8, in the first comparative example, the choke portion CH is not provided. Further, in the first comparative example, a tubular member TP3 extends, instead of the first tubular member TP1, along the outer peripheral surface of the lower electrode LE. The tubular member TP3 is made of a dielectric material such as alumina or the like and has a substantially cylindrical shape. The tubular member TP3 extends along the outer peripheral surface of the upper portion of the support SP1, the outer peripheral surface of the first plate 22a, and the outer peripheral surface of the large diameter portion 22c of the second plate 22b. Further, the upper end portion of the tubular member TP3 is engaged with the recess formed in the bottom surface of the annular member AP.

In the first comparative example, a tubular member TP4 extends, instead of the second tubular member TP2, along the outer peripheral surface of the tubular member TP3. The tubular member TP4 is made of aluminum and has a substantially cylindrical shape. The tubular member TP4 is in contact with a region between the lower end and the intermediate portion in the axis Z direction of the outer peripheral surface of the tubular member TP3 and also in contact with the outer peripheral surface of the upper portion of the support SP1. The inner peripheral portion of the baffle plate BP is disposed between the tubular member TP4 and the annular member AP.

Figure 9:
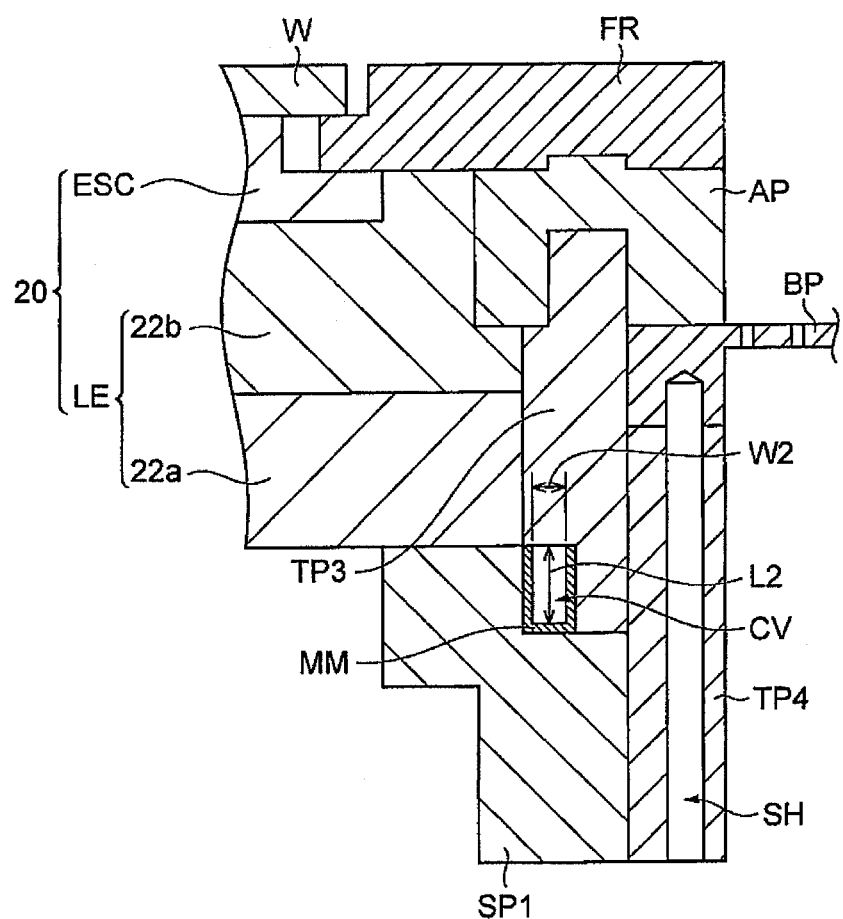
FIG. 9 shows an enlarged view of a mounting table of a second comparative example and its neighboring components.

Hereinafter, the second comparative example will be described. FIG. 9 is an enlarged view showing a part of the mounting table of the second comparative example and its neighboring components. The second comparative example is different from the first comparative example in that a cavity CV is formed at a lower inner peripheral region of the tubular member TP3 and also in that a metallic member MM surrounds a lower portion, a diametrically inner portion and a diametrically outer portion of the cavity CV, as shown in FIG. 9. In the second comparative example, the microwave, i.e., the incident wave, propagates through the tubular member TP3 in a downward direction and the reflection wave propagates through the tubular member TP3 in an opposite direction to the propagation direction of the incident wave, i.e., in an upward direction.

Hereinafter, the simulations of the plasma processing apparatus 10, the first comparative example, and the second comparative example will be described in detail. In the simulation of the plasma processing apparatus 10, a VSWR (voltage standing wave ratio) at the first tubular member TP1 was calculated while varying as parameters a length L1 and a thickness, i.e., a width W1, of the choke portion CH (see FIG. 7). Here, the VSWR can be expressed by the following Eq. (1).

$$\rho = \frac{1+\sqrt{P_r/P_f}}{1-\sqrt{P_r/P_f}} \quad (1)$$

In Eq. (1), ρ represents a VSWR; $P_r$ represents a power of the reflection wave; and $P_f$ represents a power of the incident wave. Thus, the state in which ρ is equal to 1 indicates that the microwave is not suppressed. The effectiveness of the suppression of the microwave is in direct proportion to the value of ρ.

In the simulation of the first comparative example, a VSWR at the tubular member TP3 was calculated. In the simulation of the second comparative example, the VSWR at the tubular member TP3 was calculated while varying as parameters a vertical length L2 and a horizontal width W2 of the cavity CV (see FIG. 9).

Figure 10:
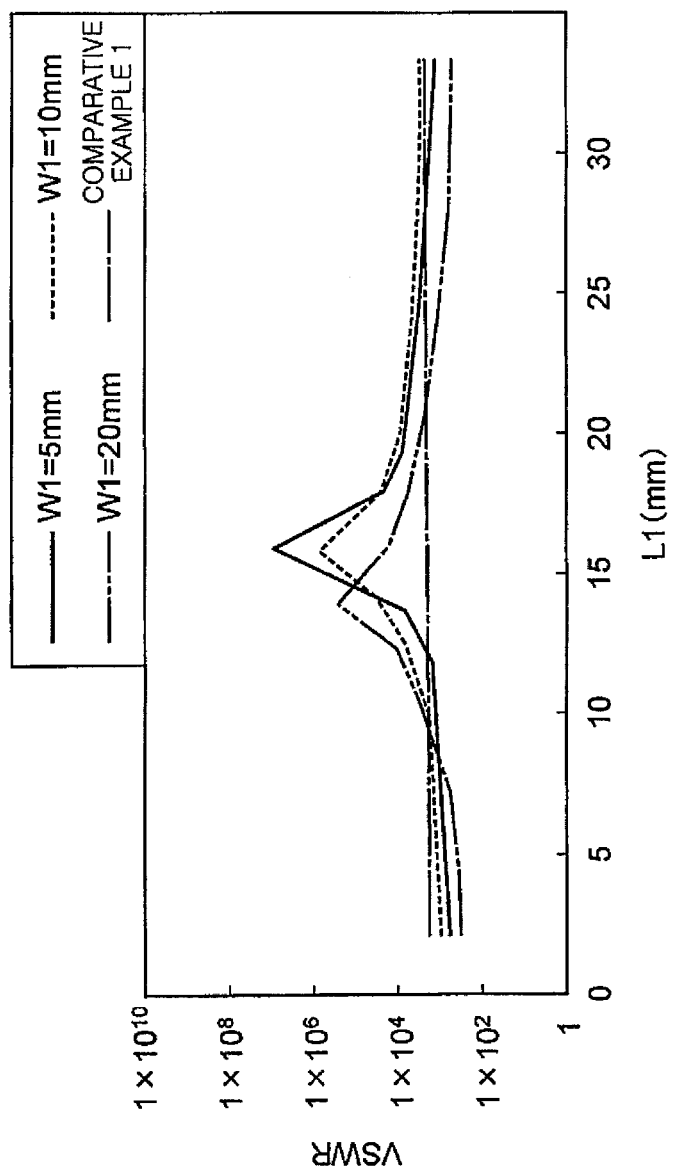
FIG. 10 is a graph showing a VSWR (Voltage Standing Wave Ratio) of the plasma processing apparatus and a VSWR of the first comparative example.
Figure 11:
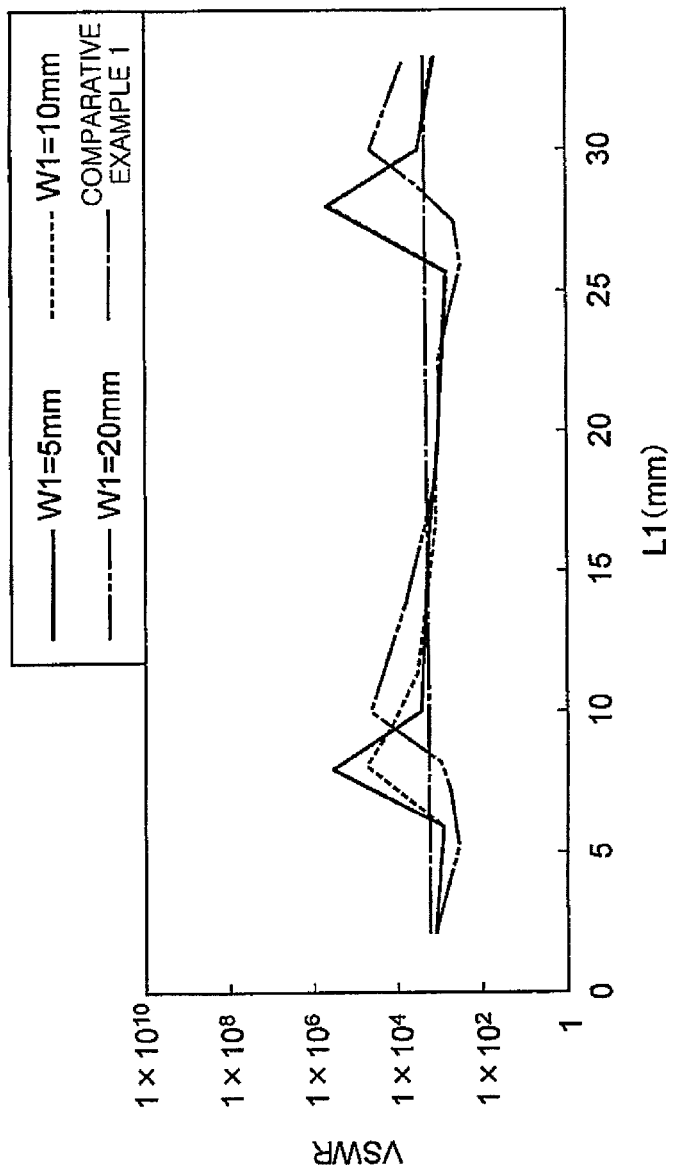
FIG. 11 is a graph showing the VSWR of the plasma processing apparatus and a VSWR of the first comparative example.
Figure 12:
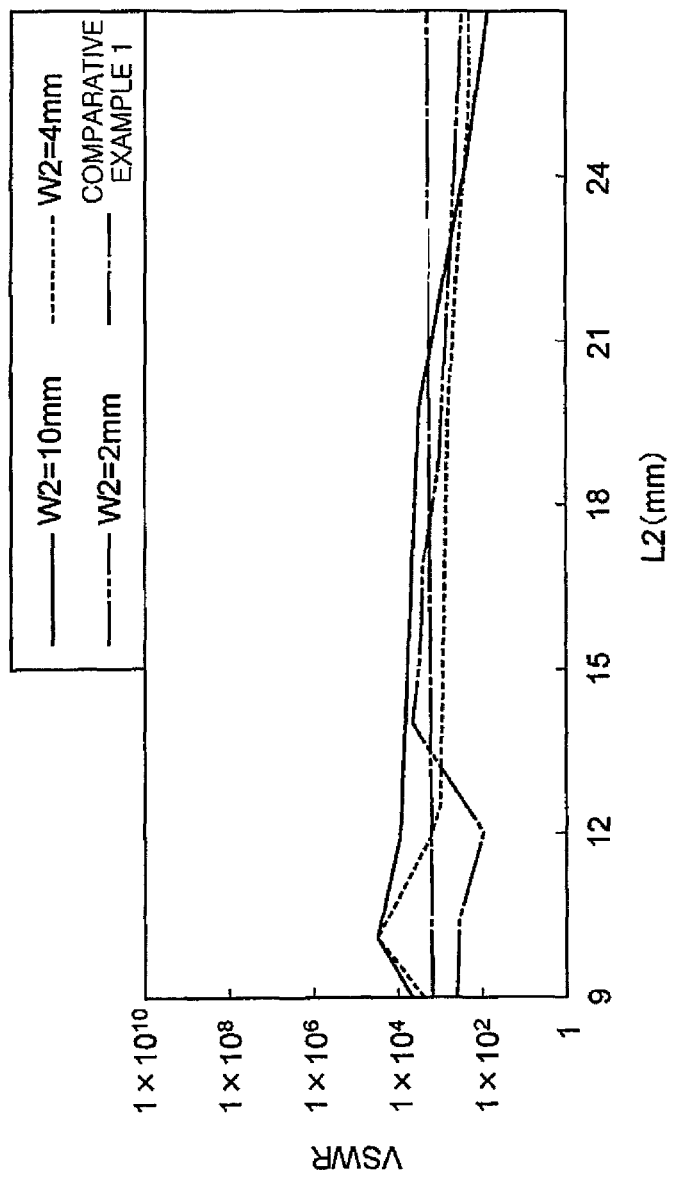
FIG. 12 is a graph showing a VSWR of the second comparative example and the VSWR of the first comparative example.

FIGS. 10 and 11 are graphs showing a VSWR of the plasma processing apparatus 10 and a VSWR of the first comparative example. In FIGS. 10 and 11, the horizontal axis indicates the length L1, and the vertical axis indicates the VSWR. FIG. 10 shows a VSWR in the case where a dielectric constant of the choke portion CH is 1, i.e., in the case where the choke portion CH is a cavity. FIG. 11 shows a VSWR in the case where a dielectric constant of the choke portion CH is 9.5, i.e., in the case where the choke portion CH is made of alumina. FIG. 12 is a graph showing a VSWR of the second comparative example and the VSWR of the first comparative example.

Referring to FIGS. 10 and 11, the simulation results show that the VSWR of the plasma processing apparatus 10 is greater than the VSWR of the first comparative example due to the choke portion CH of the plasma processing apparatus 10. Specifically, a large VSWR is obtained when the choke portion CH has a length that is about ¼ of the wavelength of the microwave in accordance with a material forming the choke portion CH.

Referring to FIGS. 10 to 12, it is clear that a VSWR of the choke portion CH is considerably greater than a VSWR of the second comparative example. This indicates that the microwave can be effectively suppressed by the choke portion CH that allows the reflection wave to propagate in a direction perpendicular to the propagation direction of the incident wave.

Figure 13A:
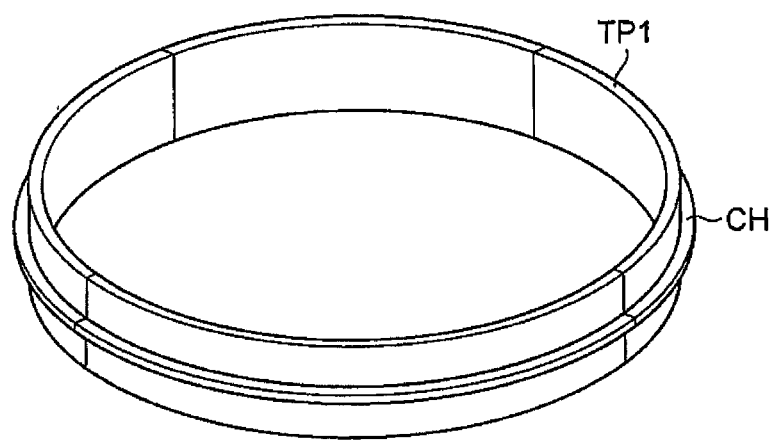
FIGS. 13A and 13B are perspective views showing a choke portion of the plasma processing apparatus and a choke portion of a third comparative example.
Figure 13B:
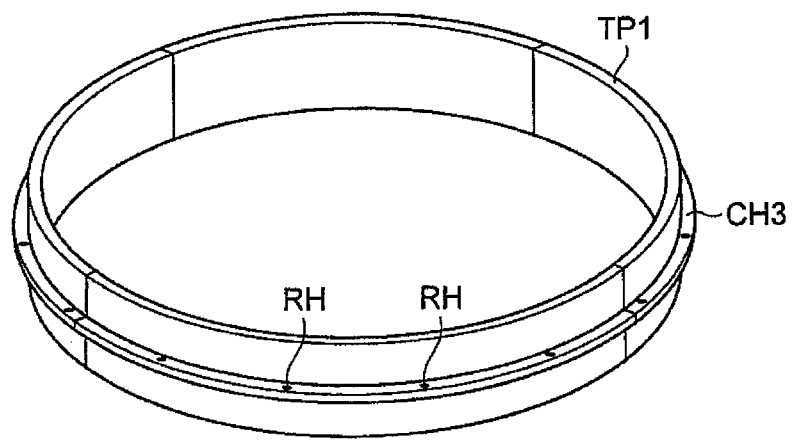

Next, a result of another simulation of the plasma processing apparatus 10 will be described. In this simulation, a VSWR of the first tubular member TP1 was obtained while using as parameters present/absence of a hole of the choke portion and a size of the hole. FIGS. 13A and 13B are perspective views showing the choke portion of the plasma processing apparatus 10 and the choke portion of the third comparative example. FIG. 13A shows the first tubular member TP1 and the choke portion CH of the plasma processing apparatus 10. FIG. 13B shows the choke portion CH3 and the first tubular member TP1 of the third comparative example. As shown in FIG. 13A, the choke portion CH of the plasma processing apparatus 10 does not have a hole. Meanwhile, as shown in FIG. 13B, the choke portion CH3 of the third comparative example has 16 holes RH spaced apart from each other at a regular interval. In this simulation, the present/absence of the hole RH and the diameter Φ of the hole RH were varied as parameters.

FIG. 14 is a graph showing a VSWR of the choke portion of the plasma processing apparatus 10 and a VSWR of the choke portion of the third comparative example. As shown in FIG. 14, a small VSWR was obtained in the third comparative example in which the choke portion CH3 has the holes RH. Meanwhile, a large VSWR was obtained in the case of using the choke portion CH. In other words, it was found that the choke portion CH having no hole can suppress leakage of the microwave and, thus, the microwave propagating through the first tubular member TP1 can be effectively suppressed.

Figure 15:
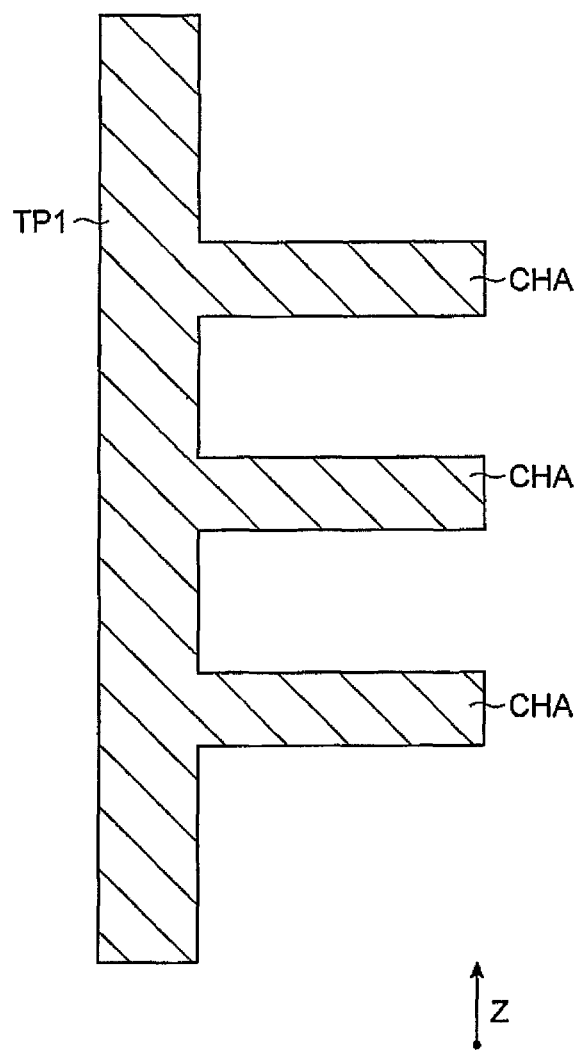
FIG. 15 is an enlarged view of choke portions in accordance with another embodiment of the present invention.

Hereinafter, a choke portion in accordance with another embodiment of the present invention will be described. FIG. 15 is an enlarged view of the choke portion in accordance with another embodiment of the present invention. As shown in FIG. 15, in the present embodiment, a plurality of choke portions CHA protrudes outward from the first tubular member TP1. The choke portions CHA have substantially the same length in the diametrical direction and are arranged at multiple levels in the axis Z direction. By arranging the choke portions CHA at multiple levels, the microwave can be more effectively suppressed.

Figure 16:
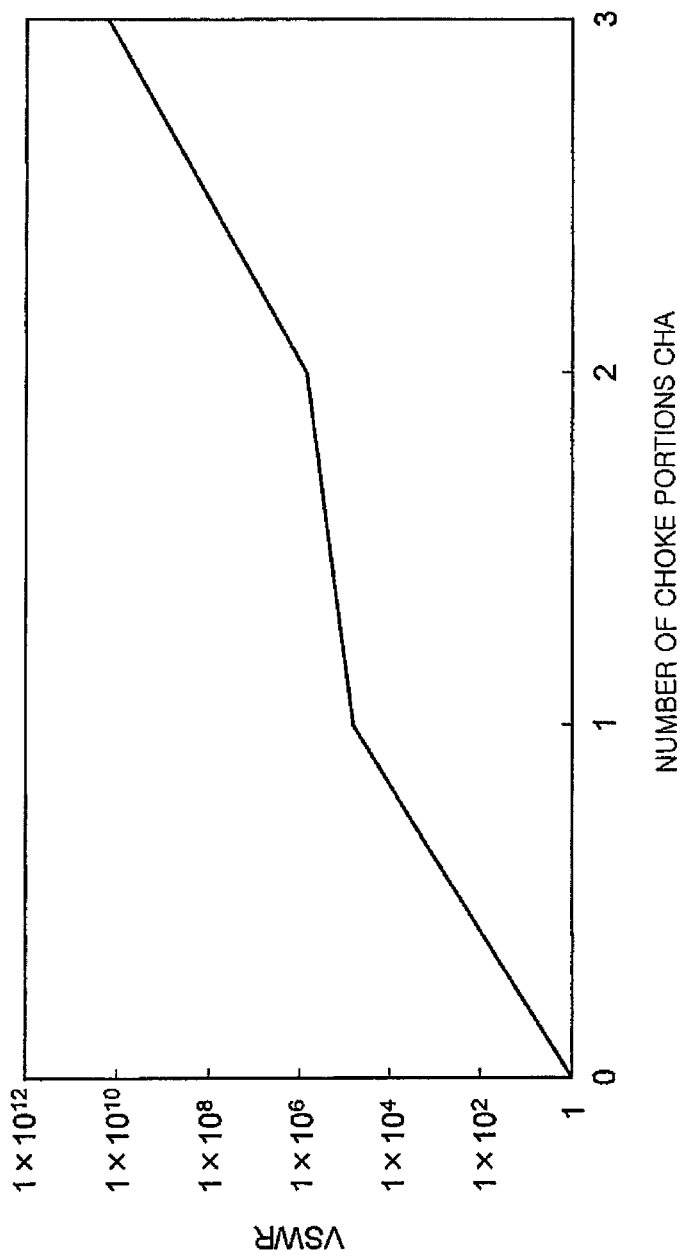
FIG. 16 shows a result of simulation on a VSWR obtained while using the number of choke portions as a parameter.

FIG. 16 shows a result of simulation of a VSWR obtained while varying the number of the choke portions CHA as a parameter. In FIG. 16, the horizontal axis indicates the number of choke portions CHA and the vertical axis indicates a VSWR. As shown in FIG. 16, the VSWR is increased as the number of choke portions CHA is increased. In other words, the simulation result shows that the microwave propagating through the first tubular member TP1 can be more effectively suppressed by a plurality of choke portions CHA.

Figure 17:
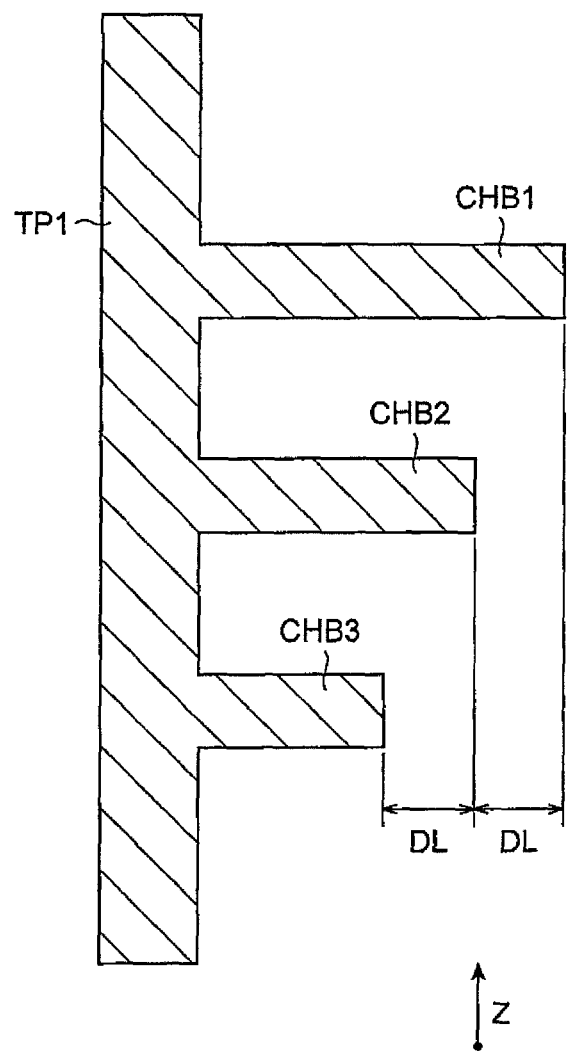
FIG. 17 is an enlarged view of choke portions in accordance with still another embodiment of the present invention.

FIG. 17 is an enlarged view of a choke portion in accordance with still another embodiment of the present invention. As shown in FIG. 17, in the present embodiment, a plurality of choke portions CHB1, CHB2 and CHB3 may protrude outward from the first tubular member TP1. The choke portions CHB1, CHB2 and CHB3 may have different lengths in the diametrical direction. The choke portions having different lengths can suppress incident waves (microwaves) having different wavelengths, i.e., different frequencies. For example, even if the frequency of the microwave is changed by change in the microwave generator 32, the microwave propagating through the first tubular member TP1 can be suppressed.

Figure 18:
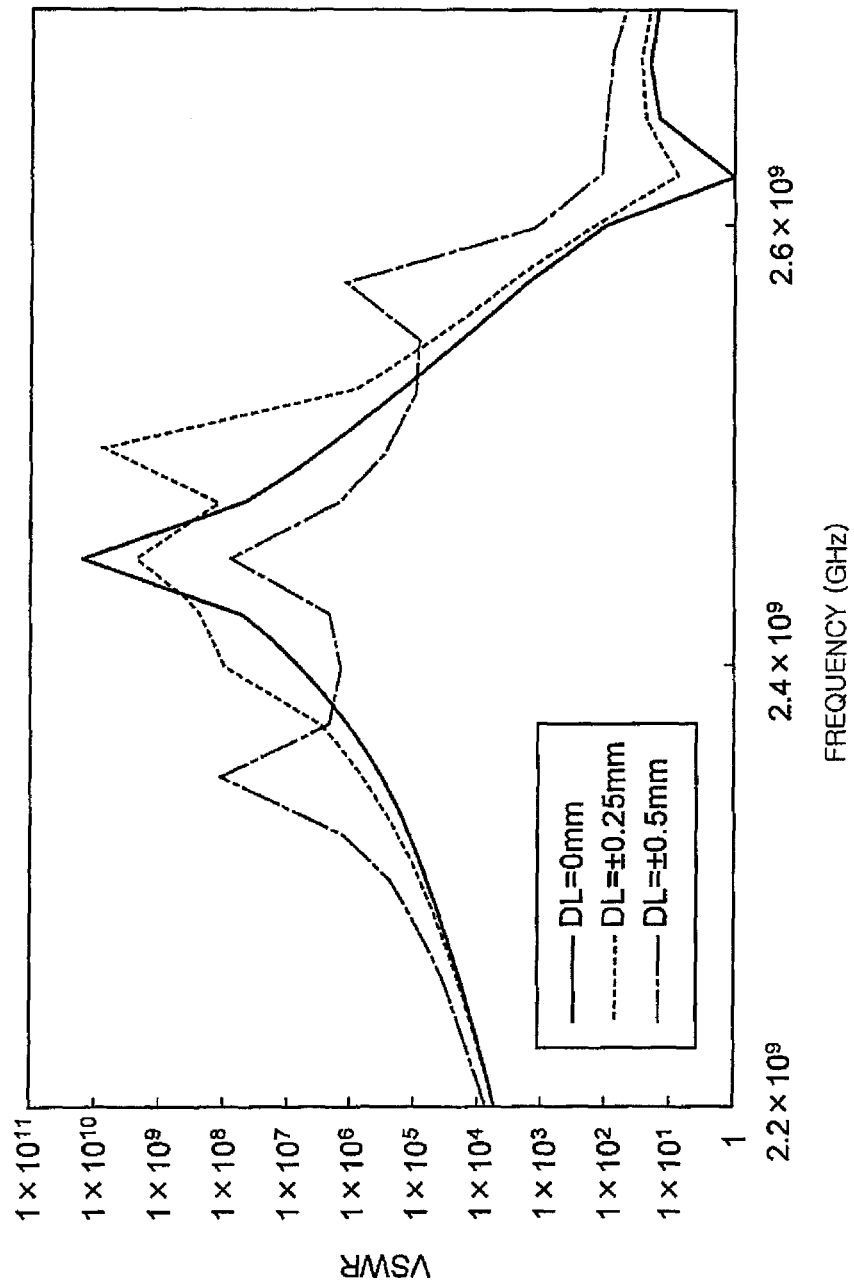
FIG. 18 is a graph showing a result of simulation of a VSWR obtained while using as a parameter a difference in lengths of a plurality of choke portions.

FIG. 18 is a graph showing a result of simulation of a VSWR at the first tubular member TP1 which was obtained while varying as a parameter a difference DL in diametrical lengths of three choke portions. In the simulation whose result is shown in FIG. 18, there was obtained a VSWR in the case where the choke portions CHB1, CHB2 and CHB3 have the same length, i.e., when DL is equal to 0. Further, in this simulation, there was obtained a VSWR in the case where the choke portion CHB1 has a length greater than that of the choke portion CHB2 by 0.25 mm and the choke portion CHB3 has a length smaller than that of the choke portion CHB2 by 0.25 mm, i.e., DL=±0.25 mm. Furthermore, in this simulation, there was obtained a VSWR in the case where the choke portion CHB1 has a length greater than that of the choke portion CHB2 by 0.5 mm and the choke portion CHB3 has a length smaller than that of the choke portion CHB2 by 0.5 mm, i.e., DL=±0.5 mm. In this simulation, the frequency of the microwave was varied as a parameter. In FIG. 18, the horizontal axis indicates a frequency of the microwave and the vertical axis indicates a VSWR. As shown in FIG. 18, as the difference DL in lengths of the choke portions CHB1, CHB2 and CHB3 is increased, the frequency range of the microwave where a large VSWR is obtained is increased. From the above, it is clear that the microwave can be suppressed in a wide band by arranging a plurality of choke portions having different lengths at multiple levels in the axis Z direction.

Hereinafter, a test performed by using the plasma processing apparatus 10 and the plasma processing apparatus of the first comparative example will be described. The plasma processing apparatus 10 is shown in FIG. 1 and has the mounting table and its neighboring components shown in FIG. 6. The plasma processing apparatus of the first comparative example is different from the plasma processing apparatus shown in FIG. 1 in that it has the mounting table and its neighboring components shown in FIG. 8 instead of the mounting table and its neighboring components shown in FIG. 6.

In this test, a silicon oxide wafer was mounted on the mounting table 20 and a plasma of Ar gas was generated by using the plasma processing apparatus 10. Further, a power of the incident wave and a power of the reflection wave at the tuner 34 were measured, and an emission intensity at 707 nm wavelength in the processing space S was measured. The 707 nm wavelength is an emission wavelength of the plasma of the Ar gas. The same test was performed on the plasma processing apparatus of the first comparative example. A power of the incident wave and a power of the reflection wave at the tuner 34 were measured and an emission intensity at 707 nm wavelength in the processing space was measured. The test using the plasma processing apparatus 10 and the test using the plasma processing apparatus of the first comparative example were performed 20 times, respectively.

Figure 19A:
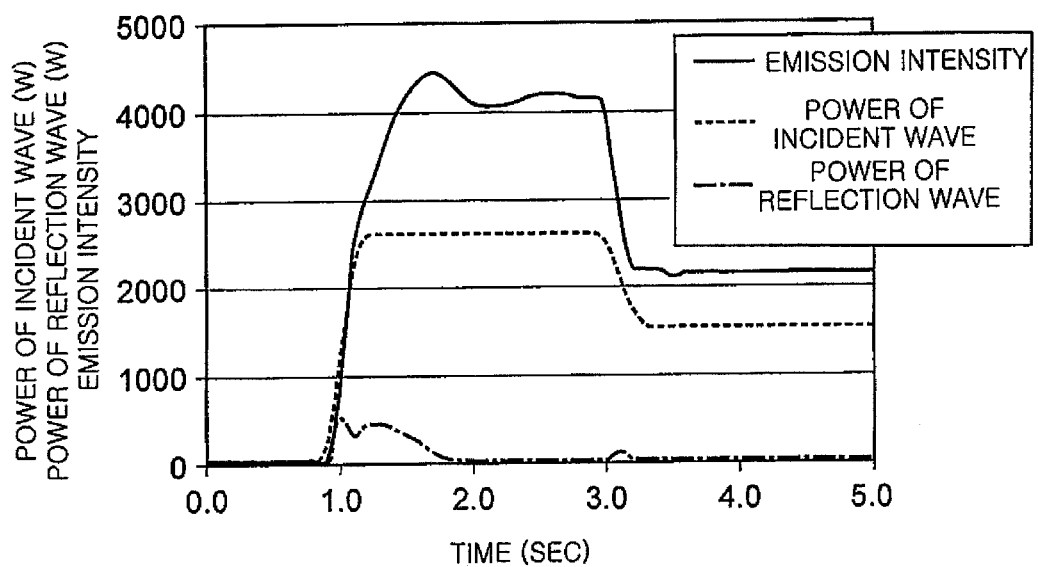
FIGS. 19A and 19B show a result of a test performed by using the plasma processing apparatus and a plasma processing apparatus of the first comparative example.
Figure 19B:
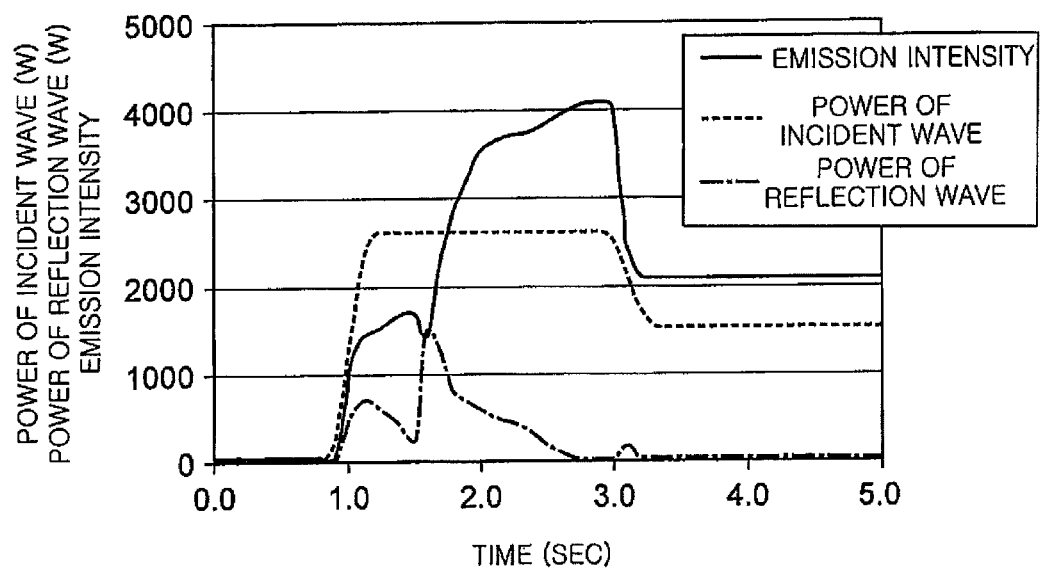

FIGS. 19A and 19B show results of the tests. FIG. 19A is a graph showing the power of the incident wave and the power of the reflection wave at the tuner 34 and the intensity of the emission (emission intensity) at a wavelength of 707 nm in the processing space which were measured in one test using the plasma processing apparatus 10. FIG. 19B is a graph showing the power of the incidence wave and the power of the reflection wave at the tuner and the intensity of the emission (emission intensity) at the wavelength of 707 nm in the processing space which were measured in one test using the plasma processing apparatus of the first comparative example. In the two graphs of FIGS. 19A and 19B, the horizontal axis indicates time and the vertical axis indicates the power of the incident wave and the power of the reflection wave at the tuner 34 and the intensity of the emission (emission intensity) at a wavelength of 707 nm in the processing space.

As shown in the graph of FIG. 19B, in the plasma processing apparatus of the first comparative example, the power of the reflection wave has two peaks during a period of time from when the supply of the microwave is started (when about 0.9 sec has elapsed) until the power of the reflection wave at the tuner 34 becomes stable (hereinafter, referred to as "period of time required for stabilization"). This is because the plasma ignition timing is different for different regions in the processing chamber by the leakage of the microwave through the tubular member TP3 and this results in impedance change. Accordingly, in the plasma processing apparatus of the first comparative example, a comparatively long period of time was required until the power of the reflection wave at the tuner became stable. In the plasma processing apparatus of the first comparative example, a comparatively long period of time was required from when the supply of the microwave was started until the emission intensity of the plasma became stable. Further, an average and a standard deviation of the period of time required for stabilization which were obtained by 20 tests using the plasma processing apparatus of the first comparative example were 1.27 sec and 0.08 sec, respectively.

Meanwhile, as can be seen from the graph of FIG. 19A, in the plasma processing apparatus 10, the period of time required for stabilization is reduced. Further, the period of time required from when the supply of the microwave is started until the emission intensity of the plasma becomes stable is considerably reduced compared to that of the plasma processing apparatus of the first comparative example. This shows that, in the plasma processing apparatus 10, the leakage of the microwave via the first tubular member TP1 is suppressed by the choke portion CH and, therefore, it is possible to reduce the period of time required from when the supply of the microwave is started until the plasma becomes stable. An average and a standard deviation of the period of time required for stabilization which were obtained by 20 tests using the plasma processing apparatus 10 were 0.81 sec and 0.04 sec, respectively.

Although various embodiments have been described, the present invention is not limited thereto and may be variously modified. For example, the plasma processing apparatus 10 includes a radial line slot antenna as an antenna for introducing a microwave. However, the present invention is not limited thereto and any plasma source capable of exciting a processing gas by using a microwave may be used.

The choke portion may be made of quartz or a material having a relative dielectric constant higher than that of alumina, such as yttrium, zirconium or the like. By using the choke portion made of a material having a high dielectric constant, the wavelength of the microwave propagating through the choke portion can be shortened. Therefore, the choke portion made of a material having a high dielectric constant may have a small length in the diametrical direction.

While the invention has been shown and described with respect to the embodiments, it will be understood by those skilled in the art that various changes and modifications may be made without departing from the scope of the invention as defined in the following claims.

What is claimed is:
1. A plasma processing apparatus for exciting a processing gas by a microwave, comprising:
 a processing chamber;
 a mounting table provided in the processing chamber, the mounting table including a lower electrode and an electrostatic chuck provided on the lower electrode;
 a focus ring made of a dielectric material, extending in an annular shape so as to surround the electrostatic chuck;
 a first tubular member made of a dielectric material, the first tubular member being wrapped around a central axis to extend along an outer periphery of the lower electrode below the focus ring;
 an annular member made of a dielectric material, provided between the focus ring and the first tubular member;
 a conductive second tubular member extending along an outer periphery of the first tubular member; and a choke portion made of a dielectric material, serving to suppress a microwave propagating through the first tubular member via the focus ring and the annular member, wherein the first tubular member and the choke portion are formed as one unit, wherein the choke portion protrudes outward in a diametrical direction of the first tubular member from the outer periphery of the first tubular member and extends in an annular shape, wherein the second tubular member includes an upper portion and a lower portion which are separable from each other, and wherein the choke portion is interposed between the upper portion and the lower portion so as to be covered by the second tubular member.

2. The plasma processing apparatus of claim 1, wherein a length of the choke portion in the diametrical direction is ¼ of a wavelength of the microwave in the choke portion.

3. The plasma processing apparatus of claim 1, wherein the upper and the lower portion are fixed to each other at a diametrically outer side of the choke portion.

4. The plasma processing apparatus of claim 1, further comprising:

one or more other choke portions made of a dielectric material, said one or more other choke portions serving to suppress the microwave propagating through the first tubular member via the focus ring and the annular member, protruding outward in the diametrical direction from the periphery of the first tubular member, and extending in an annular shape, wherein the choke portion and said one or more other choke portions are protruded from respective parts of the periphery of the first tubular member, the respect parts arranged along an extension direction of the central axis.

5. The plasma processing apparatus of claim 4, wherein the choke portion and said one or more other choke portions have different lengths in the diametrical direction respectively.

* * * * *